United States Patent [19]
Wilford

[11] Patent Number: 6,020,762
[45] Date of Patent: Feb. 1, 2000

[54] DIGITAL VOLTAGE TRANSLATOR AND ITS METHOD OF OPERATION

[75] Inventor: John R. Wilford, Boise, Id.

[73] Assignee: Micron Technology, Inc., Boise, Id.

[21] Appl. No.: 09/105,153

[22] Filed: Jun. 26, 1998

[51] Int. Cl.[7] .............................................. H03K 19/0185
[52] U.S. Cl. .................................. 326/81; 326/57; 326/68
[58] Field of Search ................................. 326/68, 70, 71, 326/80, 81, 56–58

[56] References Cited

U.S. PATENT DOCUMENTS

| 4,897,567 | 1/1990 | Bacrania | 326/68 |
| 5,406,142 | 4/1995 | Nakamara et al. | 326/68 |
| 5,736,869 | 4/1998 | Wei | 326/81 |
| 5,786,711 | 7/1998 | Choi | 326/68 |
| 5,883,538 | 3/1999 | Keeth et al. | 326/81 |

OTHER PUBLICATIONS

PAL Platform Architecture Lab, 250 Mhz Voltage Scaleable CMOS Input Buffer, A solution to support the BSRAM industry transition from 2.5 to 1.8 Volts, Intel Platform Architecture Lab Mar. 12, 1996.

*Primary Examiner*—Michael Tokar
*Assistant Examiner*—Don Phu Le
*Attorney, Agent, or Firm*—Dickenstein Shapiro Morin & Oshinsky LLP

[57] ABSTRACT

A signal translator circuit for particular use with low level logic signals is designed to accept a low level transitioning signal in a lower voltage range and output a signal transitioning within a higher voltage range. Circuitry is provided to ensure proper operation even at very low voltages. The circuitry which ensures proper operation at low voltages is selectively enabled when low input voltage input signals are used. In addition, the output signal is selectively disabled to allow downstream circuits to conserve energy during power up and power down cycles.

61 Claims, 5 Drawing Sheets

DIGITAL VOLTAGE TRANSLATOR AND ITS METHOD OF OPERATION

BACKGROUND OF THE INVENTION

1. Field of the Invention

The invention is directed to a digital voltage translator which accepts an input voltage which transitions within a lower voltage range and accurately provides an output voltage signal which transitions within a higher voltage range. More specifically, the present invention is directed to a digital voltage translator which operates with a wide range of input voltages and to its method of operation.

2. Discussion of the Related Art

Voltage translating circuits are known for interfacing between circuits which use digital signals which transition within different voltage ranges. In the memory integrated circuit area, such as in BSRAM memories, such circuits are used to translate a signal from logic circuits, which typically produce digital signals which transition within a voltage range of, e.g., 0 to 2.5 v to memory circuits which typically produce digital signals which transition within a voltage range of 0 to 3.5 v.

One such voltage translator is described in the specification entitled "250 Megahertz Voltage Scaleable CMOS Input Buffer", issued by the Intel Platform Architecture Laboratory on Mar. 12, 1996. This paper describes a one inverter shift latch and a two inverter shift latch for providing the voltage translation functions. The single inverter shift latch is shown in FIG. 1. The circuits described in the paper are designed to provide a voltage translation which will work with digital input signals which transition with a range of 0 to 1.8 v to 2.5 v and provide output signals which transition in the range of 0 to 3.1 to 3.5 volts. Although the circuitry described in this article functions well with the input voltages which it was designed for, there is increasing demand in the industry to use even lower voltages for certain logic functions. However, as the input voltage transition range in the FIG. 1 circuit is decreased, the circuitry no longer accurately produces optimum output signals. In order to accurately translate the input signals, a translator circuit must produce output signals which have a high to low (falling edge) signal level transition which takes the same amount of time as a low to high (rising edge) signal level transition. In order for this to occur, the FIG. 1 circuit transistor 107 (FIG. 1) provides less drive than does transistor 103. This compensates for the extra transistor 105 which is in the output signal path to equalize the time delay when the output signal transitions following an input signal transition. However, as the range in which the logic circuit voltage transitions decreases the voltage applied to the gates of the transistors 107 and 103 is similarly reduced which decreases the drive of these transistors. As a consequence, at some point the lowered input voltage has a negative effect on the performance of the circuit. This effect is mainly seen on transistor 107 since it provides less drive than transistor 103. As a result, the time for the high to low and low to high transitions of the output signal are no longer the same. This can be seen from a comparison of FIG. 2 which shows the high-to-low and low-to-high output signals $Vout_1$, $Vout_2$ of the FIG. 1 circuit when the input voltage transitions in the range of 0 to 2.5 volts and FIG. 3 which shows these same output signals when the input voltage transitions are in the range of 0 to 1.4 volts. FIG. 2 shows the crossing points for the output voltage at a voltage of approximately $VDD_2/2$ where $VDD_2$ is the upper voltage for the output signal when there is a low to high and high to low transition at the input signal. The rising and falling edge output signal transitions occur at virtually the same time following the input signal transition. However, as shown in FIG. 3, when a decreased input voltage range is used, e.g. 0 to 1.4 v, the rising and falling edges of the output voltage no longer occur at the same time. They are skewed by the time period $\Delta t$. This could cause timing problems in downstream memory circuits.

In addition, the voltage translating circuits described in the above-referenced article and in FIG. 1 provide an output signal at all times, that is the output signal will always transition whenever there is a transition in the input signal. Thus, during power down modes, the FIG. 1 circuit can still undergo transitions which will affect downstream circuits and cause undesired current drain.

SUMMARY OF THE INVENTION

The present invention was designed to improve upon known signal translation circuits, including that described above with respect to FIG. 1. In particular, the invention provides a circuit which increases the effective drive of transistor 107 by adding a parallel pull down path for a node C. This parallel pull down path is enabled by a control signal denoted as "low voltage". By increasing the drive to node C during low voltage operation, the overall circuit can be improved to accommodate digital input signals having smaller input voltage swings, while still providing a proper signal translation function. The "low voltage" signal can be produced in many ways, it can be a programmable reference voltage, such as by fuse connection, a bonded connection, or it can even be the output of an input signal voltage detection circuit. Thus, when the "low voltage" signal is not present, the invention is equivalent to the FIG. 1 circuit, but when the "low voltage" signal is present additional drive is provided to assist transistor 107 enabling the circuit to work with lower input voltages.

Furthermore, to reduce power consumption, the invention provides a gate at the output of the signal translator which is controlled by an external enable signal which, when absent, prevents the translator output from going into transition regardless of what happens at the input. This could be used to reduce current drain for downstream circuits during a power down operation.

The above features and advantages of the invention will be more readily understood from the following detailed description which is provided in connection with the accompanying drawings.

BRIEF DESCRIPTION OF THE DRAWINGS

FIG. 2 illustrates operation of the FIG. 1 circuit when the input signal transitions within a range it was designed to operate in;

DETAILED DESCRIPTION OF THE INVENTION

Figure 1:
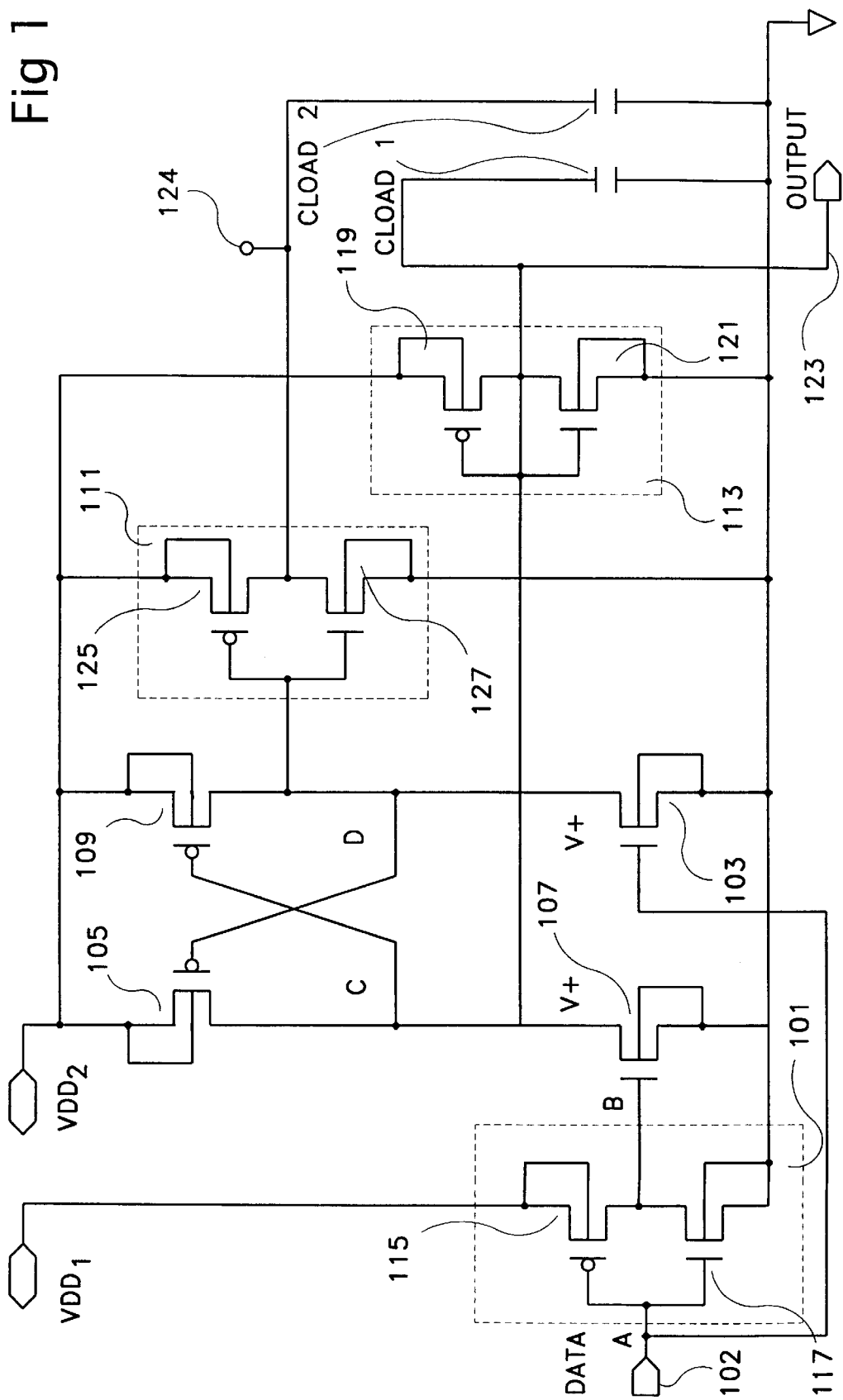
FIG. 1 is a schematic diagram of a known signal translation circuit.

Referring first to FIG. 1 which illustrates the circuitry upon which the invention improves, the translation circuit takes an input signal which transitions between 0 volts and a voltage $VDD_1$, which is typically in the range of 1.8 volts to 2.5 volts, and converts that to an output voltage which transitions between 0 volts and a higher voltage in the range of 3.1 to 3.5 volts ($VDD_2$). The purpose of the circuit is to provide a voltage level transition without requiring any standby current. In the illustrated circuit, the input data, which swings between 0 and 1.8–2.5 volts is applied to the input of an inverter circuit 101 which includes a P-channel MOS transistor 115 and an N-channel MOS transistor 117 connected in series and having their gates tied to the input terminal 102. As the input voltage swings from 0 to $VDD_1$, the applied signal crosses the threshold voltage (Vt) of N-channel MOS transistor 103, which has its gate also connected to the input terminal 102. When the input data signal exceeds the threshold voltage Vt of transistor 103 it turns on and pulls down node D to ground which turns on P-channel MOS transistor 105 which pulls up node C, that is, node C goes to the high voltage $VDD_2$. When node C goes to the high voltage $VDD_2$, that voltage is applied to inverter 113, formed by P-channel MOS transistor 119 and N-channel MOS transistor 121, which inverts the signal and produces a low voltage (e.g. ground) output at output node E. MOS transistors 105 and 109 are cross-connected and form a bi-stable circuit.

The operation of the FIG. 1 circuit as just described was for an input signal transition from low to high voltage. On the high to low transition of the input signal at terminal 102 there will be a threshold at which the node B of inverter 101 will be pulled high ($VDD_1$) due to MOS transistor 115 turning on and MOS transistor 117 turning off.

As soon as node B goes high, N-channel MOS transistor 107 will begin to conduct and pull node C down to ground voltage. In addition, N-channel MOS transistor 103 which had been pulling down the gate of MOS transistor 105 will also be turned off. As a consequence of MOS transistor 107 turning on and MOS transistor 103 turning off, the node C voltage is at ground which is in turn applied to inverter 113 which supplies an output at a voltage level $VDD_2$ to output node E. P-channel MOS transistor 109 is used to pull node D high when MOS transistor 103 turns off and MOS transistor 107 turns on. This shuts off MOS transistor 105 so there is no standby current flowing through the transistor path of MOS transistors 105 and 107.

Inverter 111 inverts the signal at node D and provides a complementary output at node F to the signal at node E. Inverter 111 also provides loading on node D so that the timing of operation for the transitions experienced by nodes C and D will be essentially the same.

Figure 2:
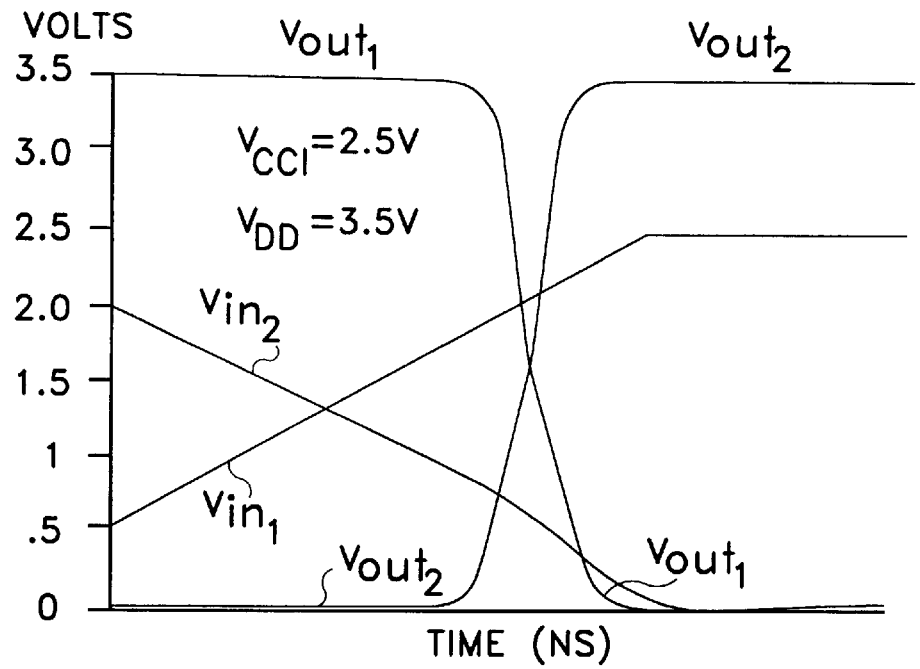
Figure 3:
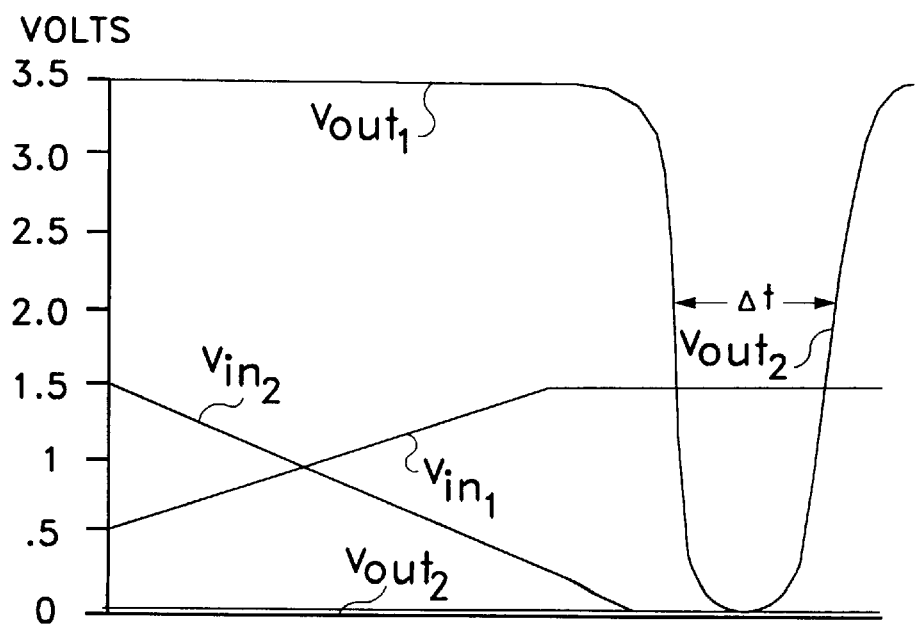
FIG. 3 illustrates operation of the FIG. 1 circuit when the input signal transitions within a decreased operating range.

The circuitry of FIG. 1 performs well when the input voltage at terminal 102 swings from 0 volts into a range of 1.8 to 2.5 volts ($VDD_1$). If a lower input voltage range is encountered, however, for example, if the input signal to the FIG. 1 circuit swings between 0 and less than 1.5 volts, e.g. 1.4 volts, then node B only transitions between 0 and 1.4 volts which does not provide sufficient gate voltage for MOS transistor 107. In a typical fabrication, MOS transistor 107 is sized much smaller than MOS transistor 103 in order to enable the FIG. 1 circuit to operate with equal timing on low to high and high to low transitions. However, when MOS transistor 107 is sized much smaller than MOS transistor 103 and when the input voltage range is likewise low, MOS transistor 107 cannot be properly driven and the circuity does not function correctly and with equal time for output node E transition from high to low and low to high. As noted earlier, this is illustrated by FIGS. 2 and 3.

Figure 4:
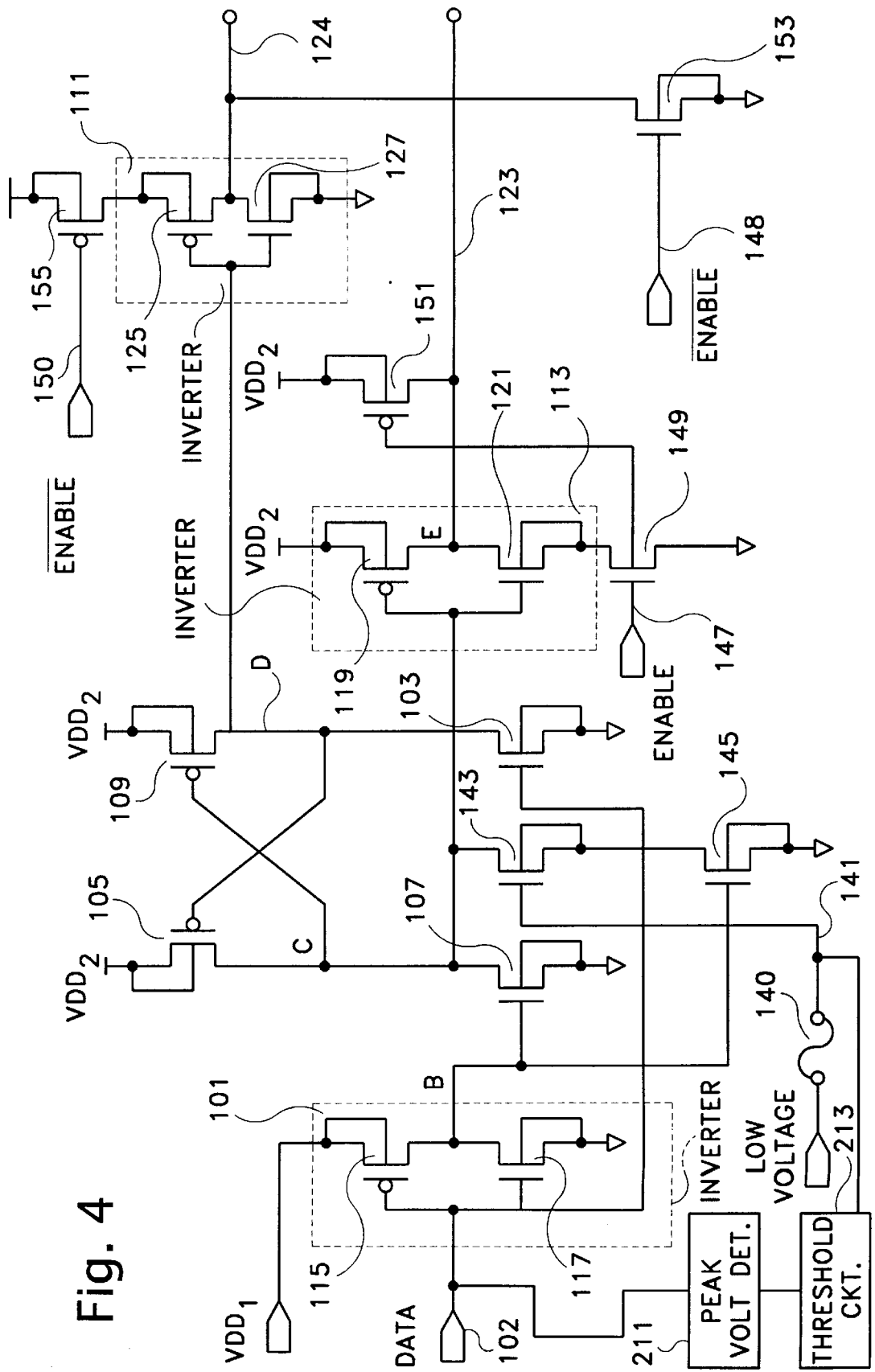
FIG. 4 is a schematic diagram of a signal translating circuit in a preferred embodiment of the invention.

FIG. 4 illustrates modifications to FIG. 1 in accordance with the present invention. To the extent that FIG. 4 employs the same elements as described above with respect to FIG. 1, they have been identified with like reference numbers. To the FIG. 1 circuit, the invention adds a "low voltage" input control line 141, a pair of N-channel MOS transistors 143 and 145 connected in a series between node C and ground with the gate input to MOS transistor 143 being connected to the low voltage line 141 and the gate to MOS transistor 145 being connected to node B. In addition, an ENABLE input terminal 147 is provided which is connected to the gate input of N-channel MOS transistor 149 which, in turn, is connected between N-channel MOS transistor 121 of inverter 113 and ground. The enable input terminal 147 is also connected to the gate of P-channel MOS transistor 151 which has its source and drains connected between output terminal 123 (node E) and supply voltage $VDD_2$.

The manner in which the FIG. 4 circuit works will now be described. It will be assumed that the FIG. 4 circuit will be operating in a low voltage mode and hence, a control signal will go "high" on the "low voltage" input line 141. This will turn on MOS transistor 143 and allow MOS transistor 145 to turn on and off and affect the voltage on node C as MOS transistors 143 and 145 are connected in a series. MOS transistor 143 provides additional drive for node C to compensate for the weak drive provided by MOS transistor 107. One end of MOS transistor 143 is connected to node C, while the other end is connected to MOS transistor 145 which has its other terminal connected to ground. With the circuit of FIG. 4 as the data input at terminal 102 makes a transition from a high to a low state, and node B goes high, MOS transistor 107, and MOS transistor 145 turn on and, node C is assuredly pulled down to zero volts (ground). Accordingly, the timely transition from high to low on the output line 123 of node E, when operating with low voltages, is ensured. MOS transistor 143 and its associated input on "low voltage" line 141 is provided so that the circuitry including MOS transistor 145 is only activated when using the FIG. 4 circuit in a low voltage mode. In other words, MOS transistors 143 and 145 are not operated when the circuit is otherwise operating with an input voltage that swings from 0 to a range of 1.8 to 2.5 volts, as the "low voltage" line 141 is disabled. The "low voltage" input control line 141 may be selectively enabled by a breakable fuse connection 140, by an open circuit but shortable antifuse, or by a bonded wire connection to thereby program the FIG. 4 circuit to operate in the low voltage mode. In lieu of a programmable fuse or antifuse or bonded connection, line 141 can be automatically enabled by sensing the peak voltage at the data input terminal 102 by a peak voltage detector 211, and when the peak voltage falls below a preset value e.g. 1.5 volts and is detected by threshold circuit 213 the "low voltage" line is enabled by a signal from the threshold circuit 213.

All other operations of the FIG. 4 circuit are as described above with respect to FIG. 1, and are not repeated herein.

The FIG. 4 circuit also provides a selective ENABLE terminal 147 and ENABLE terminals 148, 150. ENABLE and ENABLE terminals receive respective and complementary ENABLE and ENABLE control signals. When the ENABLE terminal 147 is disabled by going "low" this prevents the output line 123 (node E) from providing a transitioning data output. This is particularly useful for a power down mode of operation. In order to provide the enable/disable function, an N-channel MOS transistor 149 is provided in series between the inverter 113 and ground, which is switched on by the presence of a "high" ENABLE signal on terminal 147. When the ENABLE signal at terminal 147 is "low", MOS transistor 149 is off and no matter what happens at node C, the inverter 113 will not operate and the output signal at terminal 123 (node E) will not switch. At the same time MOS transistor 149 is turned off by a "low" signal at ENABLE terminal 147 this same "low" signal is provided to P-channel MOS transistor 151 which turns on to hold the output line 123 (node E) at the supply voltage $VDD_2$.

If the data output line 124 is used by downstream circuits, similar circuits are provided for disabling output line 124, including P-channel MOS transistor 155 which turns on in the presence of a "low" signal on ENABLE terminal 150 and is turned off by a "high" input which disables inverter 111. This same "high" input is applied, via terminal 148 to N-channel MOS transistor 153 which turns on to hold output line 124 at ground potential. As a result, when output line 123 is held "high" by the lack of an ENABLE signal at terminal 147, output line 124 is held "low".

Figure 5:
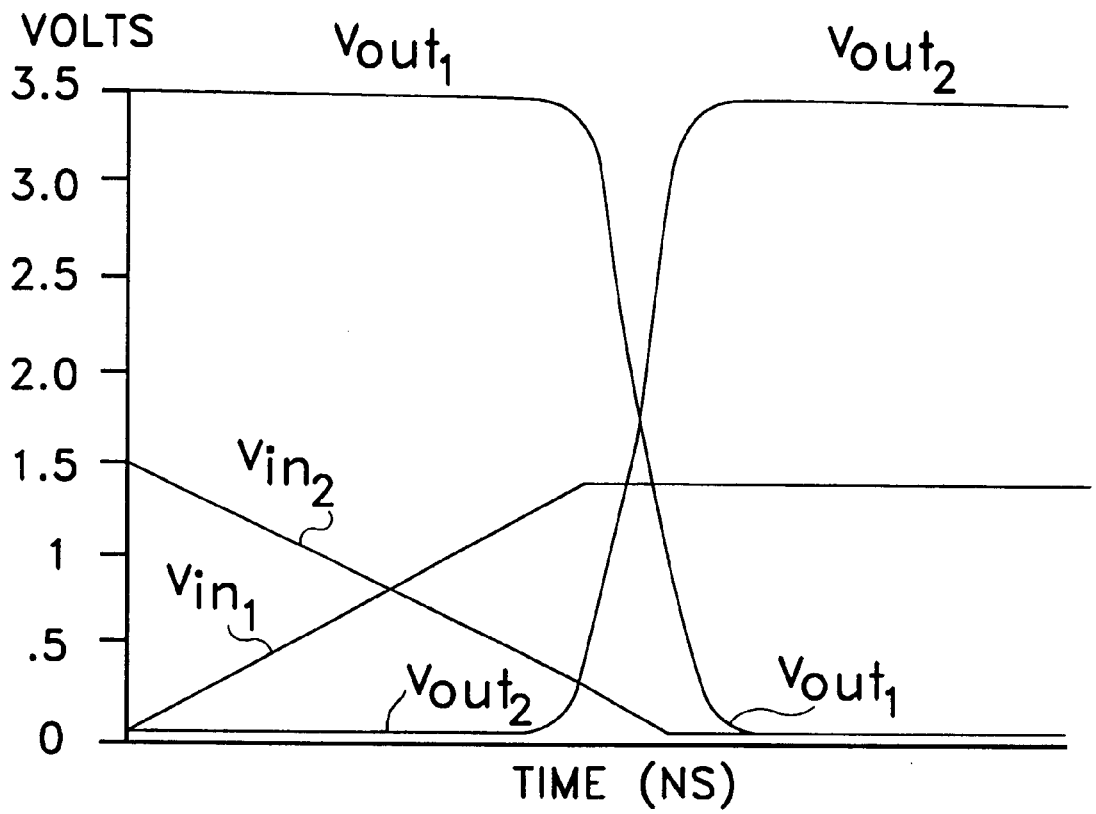
FIG. 5 illustrates operation of the FIG. 4 circuit.

FIG. 5 illustrates the output signals produced by the FIG. 4 circuit when the input voltage to the inverter 101 transitions from high to low and low to high between 0 and 1.4 volts. As shown, the output voltage of the FIG. 4 circuit (Vout) is essentially symmetrical on both transitions, unlike the output voltage Vout shown in FIG. 3. Accordingly, the FIG. 4 circuit has substantially improved signal transitions compared to the FIG. 2 circuit when a lower input voltage range e.g. less than approximately 0 to 1.5 volts, is used.

Figure 6:
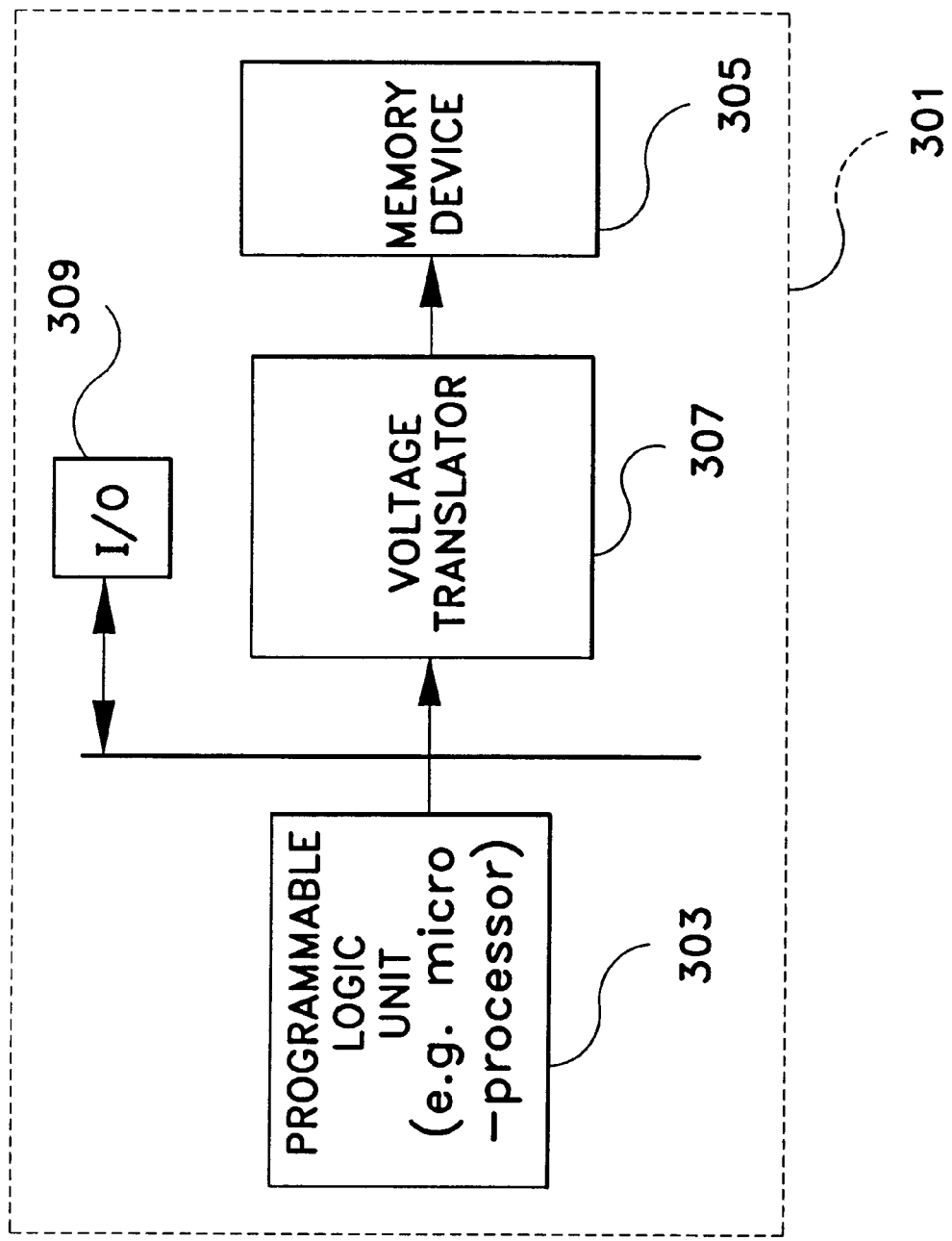
FIG. 6 illustrates an exemplary environment of use of the invention.

FIG. 6 illustrates one environment in which the invention may be used. FIG. 6 illustrates a logic system 301 containing a programmable logic unit 303 which supplies signals for control and/or storage to a memory device 305. The logic unit 303 typically operates within a voltage range which is lower than the voltage range of operation of memory device 305. Accordingly, a voltage translator 307 constructed as described above with respect to FIG. 4 provides the interface between the logic unit 303 and memory device 305.

The logic unit 303 may be a hardware or software programmable logic array or may be a processing unit such as a microprocessor. It provides the data input signals to the voltage translator 307 which provides output signals at the correct voltage level for memory device 305. In addition, the voltage translator 307 may be separate from the memory device 305 or integrated as part of the memory device 305. The logic unit 303 may also interface with other devices, such as input/output devices, e.g. display, keyboard, storage disc, etc. Still further, the logic unit 303, voltage translator 307 and memory device 305 can all be integrated on a single disc and housed in a single integrated circuit package.

Although the invention has been described and illustrated with respect to particular MOS transistors i.e. P-channel and N-channel MOS transistors, it should be apparent to one of ordinary sill in the art that a complementary circuit can be constructed. In addition, other types of transistors may also be used in order to obtain the same or similar results. These and other modifications can be easily made without departing from the spirit and scope of the invention. Accordingly, the invention is not to be construed as being limited by the foregoing description, but is only to be considered as limited by the scope of the appended claims.

What is claimed is:

1. A voltage level translating circuit comprising:
    a bi-stable circuit for selectively providing an output signal which varies between a first and second voltage level;
    an input circuit for receiving a data input signal which varies between a third and fourth voltage level and providing a data signal and its complement as output signals, each of which varies between said third and fourth voltage level, a voltage range between said first and second voltage levels being greater than a voltage range between said third and fourth voltage levels;
    a first coupling circuit responsive to one of the output signals of said input circuit for controlling the state of said bi-stable circuit;
    a second coupling circuit responsive to the other of the output signals of said input circuit for controlling the state of said bi-stable circuit; and
    a third coupling circuit responsive to one of said output signals of said input circuit for controlling said bi-stable circuit in parallel with one of said first and second coupling circuits, said third coupling circuit being selectively enabled by a first control signal.

2. A circuit as in claim 1, wherein said input circuit is an inverter, which is powered by said third and fourth voltage levels.

3. A circuit as in claim 1, wherein said first coupling circuit comprises a first transistor coupled between a first signal node of said bi-stable circuit and ground and having a gate input connected to said one of the output signals of said input circuit.

4. A circuit as in claim 3, wherein said second coupling circuit comprises a second transistor coupled between a second signal node of said bi-stable circuit and ground and having a gate input connected to said other of the output signals of said input circuit.

5. A circuit as in claim 4, wherein said third coupling circuit comprises a third transistor coupled between one of said first and second nodes of said bi-stable circuit and ground and having a gate input for receiving one of said output signals of said input circuit and a controlled circuit, said controlled circuit selectively permitting operation of said third transistor in accordance with said first control signal.

6. A circuit as in claim 5, wherein said controlled circuit comprises a fourth transistor connected between said one of said first or second nodes of said bi-stable circuit and said third transistor, said fourth transistor having its gate coupled to received said first control signal.

7. A circuit as in claim 1, further comprising:
    at least one output terminal for receiving at least one of the output signals of said bi-stable circuit;
    an output circuit for coupling at least one of the output signals of said bi-stable circuit to said at least one output terminal.

8. A circuit as in claim 7, wherein said output circuit comprises a selective blocking circuit for preventing changes in the output signals of said bi-stable circuit from being received at said at least one output terminal, said selective blocking circuit being responsive to a second control signal.

9. A circuit as in claim 8, wherein said output circuit further comprises an inverter circuit, said blocking circuit disabling operation of said inverter circuit in response to said second control signal.

10. A circuit as in claim 9, wherein said blocking circuit further comprises a circuit for holding said at least one output terminal at one or said first and second voltages in response to said second control signal.

11. A circuit as in claim 9, wherein said blocking circuit comprises a fifth transistor for selectively enabling or disabling operation of said output inverter circuit in response to a second control signal.

12. A circuit as in claim 11, wherein said holding circuit comprises a sixth transistor for selectively coupling said output terminal to a predetermined one of said first and second voltage levels when said inverter circuit is disabled.

13. A circuit as in claim 1, wherein said voltage level translating circuit is embodied in a packaged integrated circuit and said first control signal is received at a terminal of the integrated circuit package.

14. A circuit as in claim 1, wherein said voltage level translating circuit is embodied in an integrated circuit and said first control signal is programmable to a particular state within said integrated circuit.

15. A circuit as in claim 1, wherein said first voltage level is approximately zero volts and said second output voltage level is in a range of 3.1 to 3.5 volts.

16. A circuit as in claim 15, wherein said third voltage level is approximately zero volts and said fourth voltage level is less than 1.5 volts.

17. A circuit as in claim 1, further comprising a programmable element for selectively programming the state of said first control signal.

18. A circuit as in claim 1 further comprising a voltage sensing circuit for detecting a peak voltage level of said third and fourth voltage levels and a comparison circuit for comparing the peak voltage against a threshold and providing said first control circuit when said detected peak voltage is below said threshold.

19. A circuit as in claim 18, wherein said threshold is approximately 1.5 volts.

20. A computer system comprising:
   a central processing unit;
   a memory device communicating with said central processing unit, said memory device including a voltage translating circuit, said voltage translating circuit comprising:
      a bi-stable circuit for selectively providing an output signal which varies between a first and second voltage level;
      an input circuit for receiving a data input signal which varies between a third and fourth voltage level and providing a data signal and its complement as output signals, each of which varies between said third and fourth voltage level, a voltage range between said first and second voltage levels being greater than a voltage range between said third and fourth voltage levels
      a first coupling circuit responsive to one of the output signals of said input circuit for controlling the state of said bi-stable circuit;
      a second coupling circuit responsive to the other of the output signals of said input circuit for controlling the state of said bi-stable circuit; and
      a third coupling circuit responsive to one of said output signals of said input circuit for controlling said bi-stable circuit in parallel with one of said first and second coupling circuits, said third coupling circuit being selectively enabled by a first control signal.

21. A computer system as in claim 20, wherein said input circuit is an inverter, which is powered by said third and fourth voltage levels.

22. A computer system as in claim 20 wherein said first coupling circuit comprises a first transistor coupled between a first signal node of said bi-stable circuit and ground and having a gate input connected to said one of the output signals of said input circuit.

23. A computer system as in claim 22, wherein said second coupling circuit comprises a second transistor coupled between a second signal node of said bi-stable circuit and ground and having a gate input connected to said other of the output signals of said input circuit.

24. A computer system as in claim 23, wherein said third coupling circuit comprises a third transistor coupled between one of said first and second nodes of said bi-stable circuit and ground and having a gate input for receiving one of said output signals of said input circuit, and a controlled circuit, said controlled circuit selectively permitting operation of said third transistor in accordance with said first control signal.

25. A computer system as in claim 24, wherein said controlled circuit comprises a fourth transistor connected between said one of said first or second nodes of said bi-stable circuit and said third transistor, said fourth transistor having its gate coupled to received said first control signal.

26. A computer system as in claim 20 comprising:
   at least one output terminal for receiving at least one of the output signals of said bi-stable circuit;
   an output circuit for coupling at least one of the output signals of said bi-stable circuit to said at least one output terminal.

27. A computer system as in claim 26, wherein said output coupling circuit comprises a selective blocking circuit for preventing changes in the output signals of said bi-stable circuit from being received at said at least one output terminal, said selective blocking circuit being responsive to a second control signal.

28. A computer system as in claim 27 wherein said coupling circuit further comprises an inverter circuit, said blocking circuit disabling operation of said inverter circuit in response to said second control signal.

29. A computer system as in claim 28, wherein said blocking circuit further comprises a circuit for holding said at least one output terminal at one of said first and second voltages in response to said second control signal.

30. A computer system as in claim 28, wherein said blocking circuit comprises a fifth transistor for selectively enabling or disabling operation of said output inverter circuit in response to a second control signal.

31. A computer system as in claim 30, wherein said holding circuit comprises a sixth transistor for selectively coupling said output terminal to a predetermined one of said first and second voltage levels when said inverter circuit is disabled.

32. A computer system as in claim 20, wherein said voltage level translating circuit is embodied in a packaged integrated circuit and said first control signal is received at a terminal of the integrated circuit package.

33. A computer system as in claim 20, wherein said voltage level translating circuit is embodied in an integrated circuit and said first control signal is programmable to a particular state within said integrated circuit.

34. A computer system as in claim 20, wherein said first voltage level is approximately zero volts and said second voltage level is in a range of 3.1 to 3.5 volts.

35. A computer system as in claim 34, wherein said third voltage level is approximately zero volts and said fourth voltage level is less than 1.5 volts.

36. A computer system as in claim 20 further comprising a programmable element for selectively programming the state of said first control signal.

37. A computer system as in claim 20 further comprising a voltage sensing circuit for detecting a peak voltage level of said third and fourth voltage levels and a comparison circuit for comparing the peak voltage against a threshold and providing said first control circuit when said detected peak voltage is below said threshold.

38. A computer system as in claim 37, wherein said threshold is approximately 1.5 volts.

39. A voltage level translating method comprising the steps of:
- a). operating a first circuit to selectively provide an output signal which varies between a first and second voltage level;
- b). receiving a data input signal which varies between a third and fourth voltage level and providing a data signal and its complement as first and second output signals, each of which varies between said third and fourth voltage level, a voltage range between said first and second voltage levels being greater than a voltage range between said third and fourth voltage levels;
- c). controlling the operating state of said first circuit with said first and second output signals; and,
- d). additionally and selectively controlling, in response to the state of an applied first control signal, the operating state of said first circuit with one of said first and second output signals.

40. A method as in claim 39 further comprising the steps of:
providing a signal representing an output signal of said first circuit at an output terminal;
selectively inhibiting said providing step in response to the state of a second applied control signal.

41. A method as in claim 40 further comprising the step of:
holding said output terminal at one of said first and second voltage levels when said providing step is inhibited.

42. A method as in claim 40 wherein said providing step provides a signal at said output terminal which is an inverted signal of said first circuit.

43. A method as in claim 39 further comprising the step of programming the state of said first control signal, step (d) being operative or not operative to additionally control the operating state of said first circuit in accordance with the programmed condition of said first control signal.

44. A method as in claim 39 further comprising detecting the level of at least one of said third and fourth voltages and controlling the state of said first control signal in accordance with whether the detected voltage level is less than or equal to a predetermined threshold.

45. A method as in claim 44 wherein said predetermined threshold is 1.5 volts.

46. A method of operating a system which contains a logic unit, a memory device which communicates with said logic unit, and a voltage translating circuit which provides in put signals t o said memory device from said logic unit, said method comprising the steps of:
- a.) operating a firs t circuit to selectively provide an output signal which varies between a first and second voltage level to said memory device;
- b.) receiving a data input signal from said logic unit which varies between a third and fourth voltage level and providing a data signal and its complement as first and second output signals, each of which varies between said third and fourth voltage level, a voltage range between said first and second voltage levels being greater than a voltage range between said third and fourth voltage levels;
- c.) controlling the operating state of said first circuit with said first and second output signals; and
- d.) additionally and selectively controlling, in response to the state of an applied first control signal, the operating state of said first circuit with one of said first and second output signals.

47. A method as in claim 46 wherein said logic unit is a programmable logic unit.

48. A method as in claim 47 wherein said logic unit is a central processing unit.

49. A method as in claim 46, further comprising the steps of:
providing a signal representing an output signal of said first circuit at an output terminal;
selectively inhibiting said providing step in response to the state of a second applied control signal.

50. A method as in claim 49, further comprising the step of:
holding said output terminal at one of said first and second voltage levels when said providing step is inhibited.

51. A method as in claim 49, wherein said providing step provides a signal at said output terminal which is an inverted signal of said first circuit.

52. A method as in claim 46, further comprising the step of programming the state of said first control signal, step (d) being operative or not operative to additionally control the operating state of said first circuit in accordance with the programmed condition of said first control signal.

53. A method as in claim 46, further comprising detecting the level of at least one of said third and fourth voltages and controlling the state of said first control signal in accordance with whether the detected voltage level is less than or equal to a predetermined threshold.

54. A voltage translating circuit comprising:
- a first inverter for receiving a data input signal which transitions within a first voltage range and for providing, in response to said data input signal, complementary output signals which transition within said first voltage range;
- a bi-stable circuit which has two stable states;
- a first transistor having a signal path coupled between a first signal node of said bi-stable circuit and ground, said first transistor receiving one of said complementary output signals as a control input thereto;
- a second transistor having a signal path coupled between a second signal node of said bi-stable circuit and ground, said second transistor receiving the other of said complementary output signals as a control input thereto;
- at least one of said first and second signal nodes of said bi-stable circuit providing an output signal which transitions within a second voltage range which is greater than said first voltage range;
- a third and fourth transistor having their signal paths connected in series, said series connected third and fourth transistors being connected between one of said nodes and ground, one of said third and fourth transistors receiving one of said complementary output signals as a control input thereto, the other of said third and fourth transistors receiving an applied control signal as a control input thereto; and
- an output terminal coupled to receive an output signal from one of said nodes of said bi-stable circuit.

55. A voltage translating circuit as in claim 54, further comprising a second inverter for coupling an output signal from said one of said nodes to said output terminal.

56. A voltage translating circuit as in claim 54, wherein all of said transistors are MOS transistors.

57. A voltage translating circuit as in claim 54 further comprising a voltage supply circuit for supplying said applied control signal.

58. A voltage translating circuit as in claim 57 wherein said applied voltage signal is program table to a specific value.

59. A voltage translating circuit as in claim 58 wherein said applied voltage signal is generated by a voltage source which is coupled to said one of said third and fourth transistor through a programmable fusible link.

60. A voltage translating circuit as in claim 58 wherein said applied voltage signal is generated by a voltage source which is coupled to said one of said third and fourth transistors through a programmable short-circuit element.

61. A voltage translating circuit as in claim 46, further comprising a controllable disabling circuit for selectively preventing the coupling of said output signal from one of said nodes of said bi-stable circuit to said output terminal.

* * * * *

UNITED STATES PATENT AND TRADEMARK OFFICE
CERTIFICATE OF CORRECTION

PATENT NO.     : 6,020,762
DATED          : February 1, 2000
INVENTOR(S)    : John R. Wilford It is certified that error appears in the above-identified patent and that said Letters Patent is hereby corrected as shown below:

<u>Column 9,</u>
Line 48, reads "in put" should read -- input --;
Line 49, reads "t o" should read -- to --;
Line 51, reads "firs t" should read -- first --.

Signed and Sealed this

Twenty-third Day of July, 2002

Attest:

Attesting Officer

JAMES E. ROGAN
*Director of the United States Patent and Trademark Office*